(12) United States Patent
Shinya et al.

(10) Patent No.: US 6,573,031 B2
(45) Date of Patent: Jun. 3, 2003

(54) APPARATUS AND METHOD OF THERMAL PROCESSING AND METHOD OF PATTERN FORMATION

(75) Inventors: Hiroshi Shinya, Koshi-Machi (JP); Kazuyoshi Mizumoto, Tosu (JP); Kazuhisa Hayashida, Tokyo-To (JP); Eiichi Sekimoto, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/017,450

(22) Filed: Dec. 18, 2001

(65) Prior Publication Data

US 2002/0076659 A1 Jun. 20, 2002

(30) Foreign Application Priority Data

Dec. 19, 2000 (JP) ........................................ 2000-385187

(51) Int. Cl.⁷ .............................. G03F 7/16; G03F 7/30; G03F 7/38; B05C 11/00; B05C 11/02

(52) U.S. Cl. ........................ 430/325; 430/327; 430/330; 118/59; 118/64; 118/101; 118/663; 118/665; 427/378

(58) Field of Search ................................. 430/327, 330, 430/325; 118/59, 64, 101, 663, 665; 427/378

(56) References Cited

U.S. PATENT DOCUMENTS 6,190,459 B1    2/2001    Takeshita et al. ........... 118/715

*Primary Examiner*—Richard L. Schilling
(74) *Attorney, Agent, or Firm*—Oblon, Spivak, McClelland, Maier & Neustadt, P.C.

(57) ABSTRACT

A substrate coated with a coating solution is placed on a heating plate in a processing chamber in which an inert gas is circulating. The substrate is heated on the heating plate while the inert gas is circulating at an extremely small first circulating amount. The substrate is heated further on the heating plate while the inert gas is circulating at a second circulating amount larger than the first circulating amount. Detected is the density of the solvent in the processing chamber. The supply and exhaust amounts of the inert gas are controlled based on the density detected after the start of heating, so that an exhaust amount of the inert gas becomes a predetermined amount for a predetermined period until the solvent density reaches a predetermined density. A necessary control process is performed so that the solvent density reaches the predetermined density when the solvent density has not reached or exceeded the predetermined density after the predetermined period has elapsed. The two-time thermal-process or solvent-density control promotes evaporation of the resist solvent while restricting scattering of a photo-oxidizing agent included in the resist from being promoted beyond the wafer surface, thus achieving coated-film uniformity for the thermal process.

22 Claims, 9 Drawing Sheets

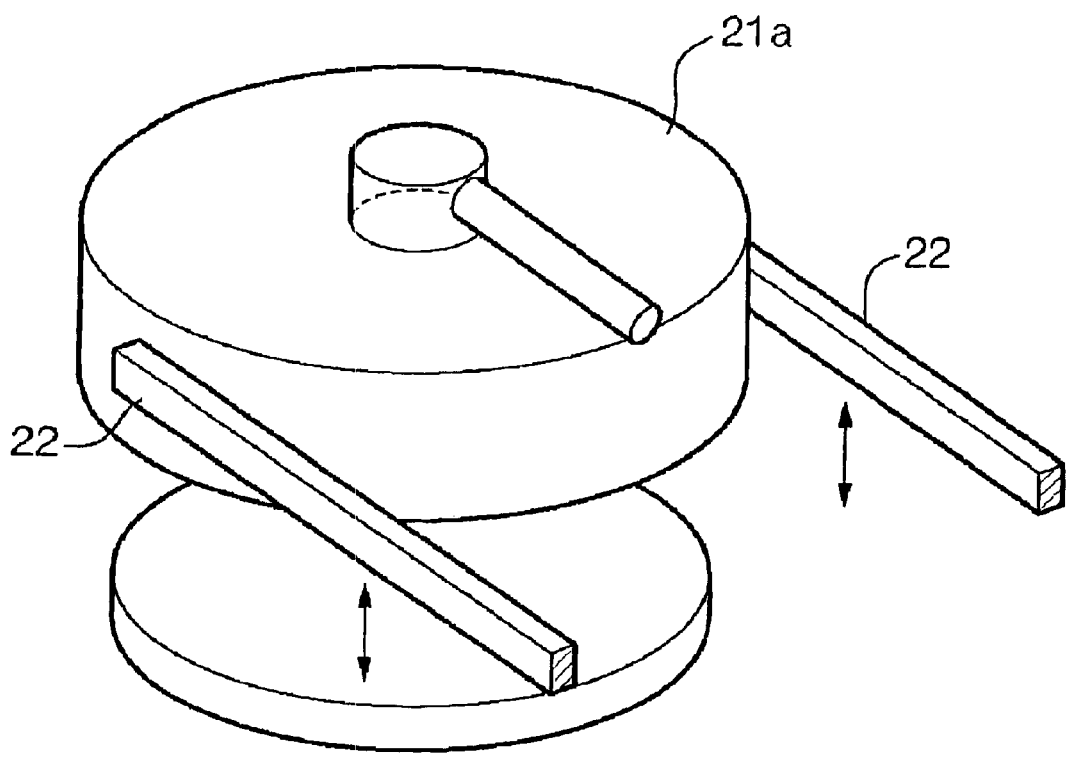
F I G. 4
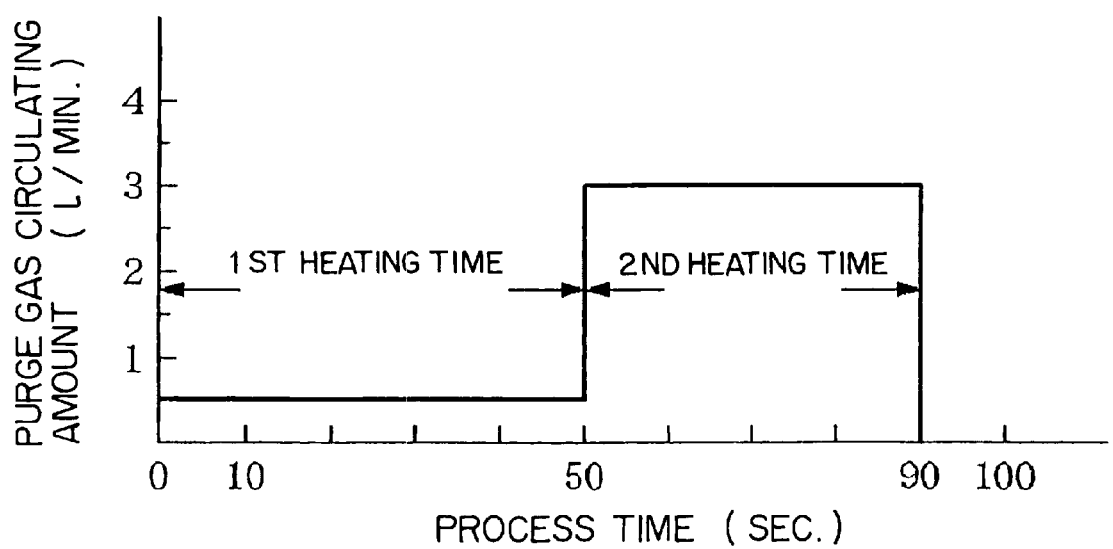
F I G. 5

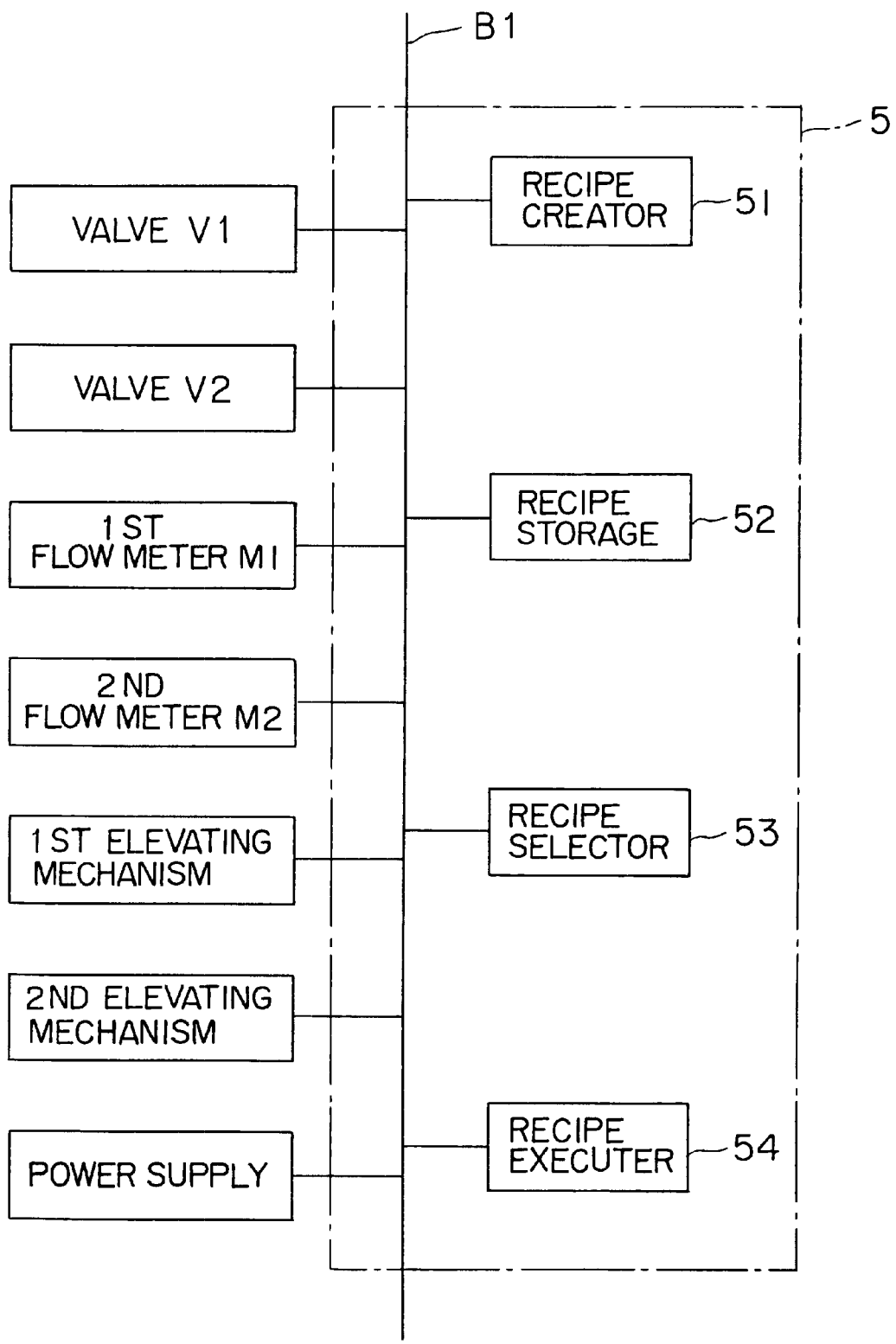
F I G. 6

PROCESS-RECIPE SETTINGS

| HEATING TEMPERATURE | ○○○ °C |

| HEATING TIME | ○○○ SEC. |

| 1 ST PERIOD | ○○○ SEC. |

1 ST CIRCULATING AMOUNT

○○○ LITER / MIN.

| 2 ND PERIOD | ○○○ SEC. |

2 ND CIRCULATING AMOUNT

○○○ LITER / MIN.

F I G. 7

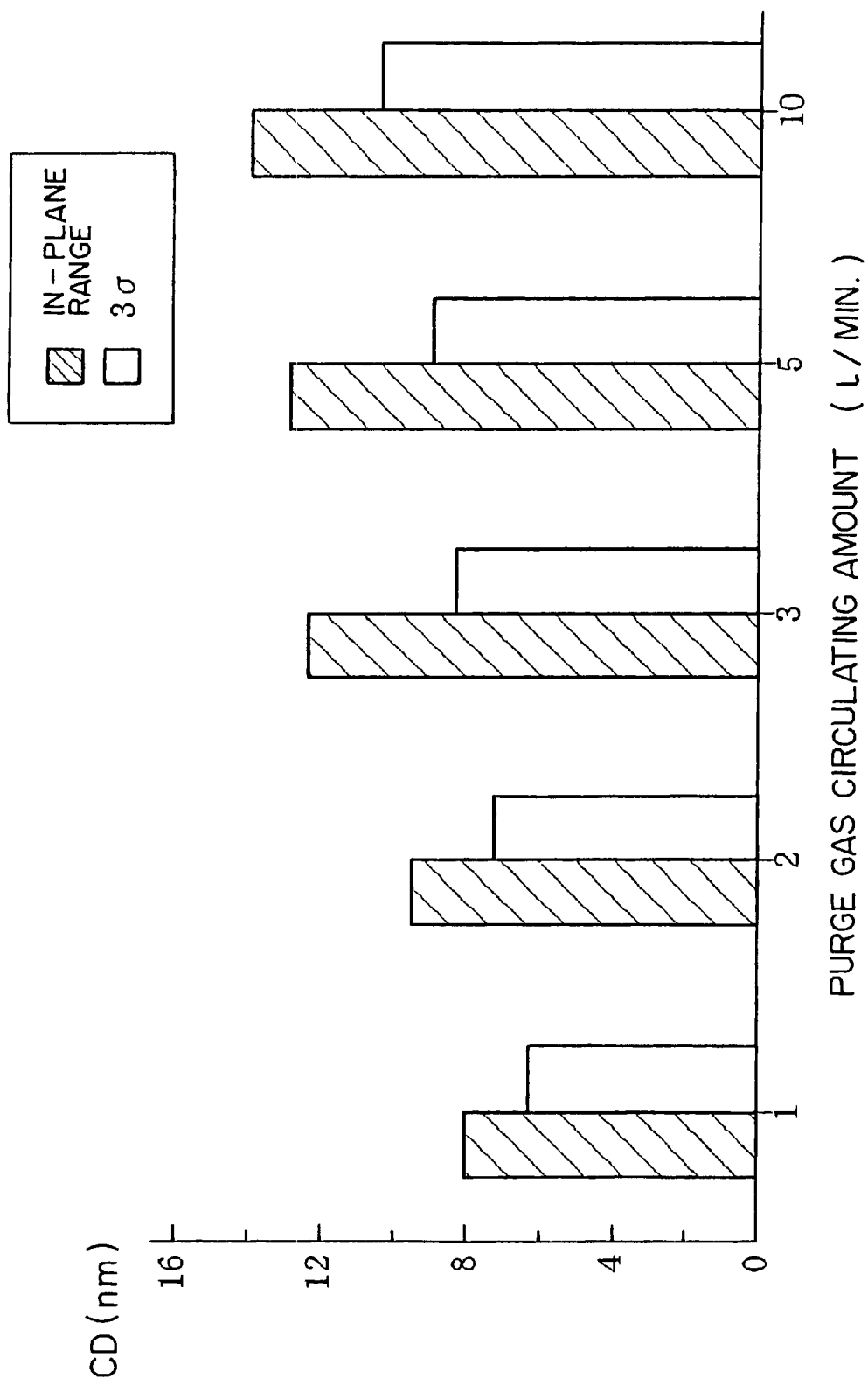
F I G. 9

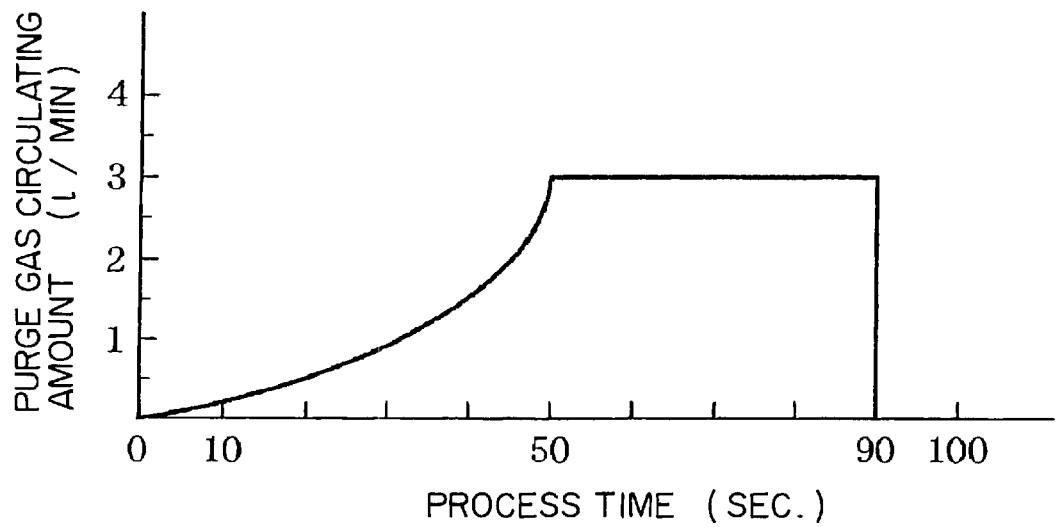
F I G. 10
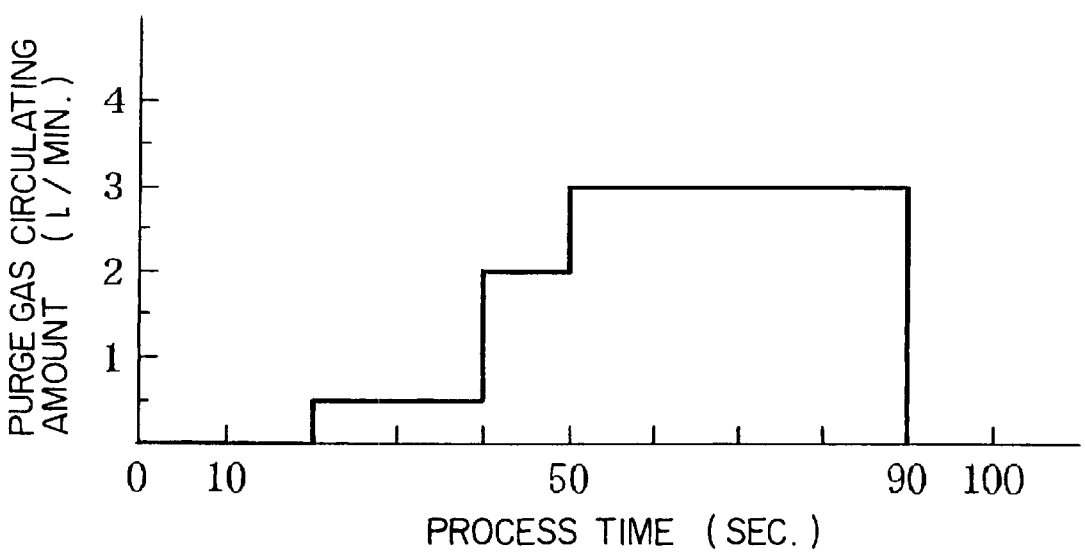
F I G. 11

_US 6,573,031 B2_

APPARATUS AND METHOD OF THERMAL PROCESSING AND METHOD OF PATTERN FORMATION

FIELD OF THE INVENTION

The present invention relates to an apparatus and a method of thermal process for evaporating a solvent for a resist coated on substrates such as semiconductor wafers, LCD substrates (glass substrates used for liquid-crystal displays) and a method of forming a pattern on each substrate including the thermal processing method.

BACKGROUND OF THE INVENTION

Photo lithographic techniques in process for manufacturing semiconductor devices and LCDs, etc., include the following steps.

Firstly, a resist solution is applied on a substrate such as a semiconductor wafer (called wafer hereinafter) to form a resist film. The resist film is exposed to a desired pattern through a photomask. A patterned resist film is then formed through a developing process.

Chemical-amplifying-type resist is one of resist solutions. This type of resist will generate acid when exposed. The acid acts as a catalyst when dispersed in thermal process to dissolve or change the molecular structure of a base resin as the major component of the resist. Through this procedure, the chemical-amplifying-type becomes soluble.

Photolithographic procedure in a processing system in which a coating and developing apparatus for resist-solution coating and developing processes and an exposing apparatus is connected includes the following steps.

After a wafer has been coated with a resist solution, it is heated to a predetermined temperature for evaporating a solvent for the resist solution. The wafer is then cooled to another predetermined temperature before exposed by the exposing apparatus. The exposed wafer is heated again to still another predetermined temperature for promoting acid-resolving reaction to a developing solution (resist-developing reaction). The wafer is cooled again to further predetermined temperature for protecting it from exceeded resolving reaction, followed by coating of a developing solution for developing process.

The thermal process after resist coating is performed for a wafer set, for a predetermined period, on a heating plate adjusted to a predetermined temperature in a processing chamber, for example.

This thermal process is performed for evaporating a resist solvent as described above. For this purpose, the chamber gas discharged while a purge gas such as air is flowing into the processing chamber so that the evaporated components of the resist solvent will not be accumulated in the processing chamber. The evaporated components are taken out with a flow of the purge gas.

Chemical-amplifying-type resists, however, have a characteristic of causing variation in pattern width after developing process. The inventers for this invention have found a correlation between the uniformity of pattern width and a flow of purge gas in a processing chamber. In detail, it has been founded that the more the flow of purge gas, the worse the uniformity of pattern width.

The uniformity of pattern width will become better when a flow of purge gas is stopped in a processing chamber. Nonetheless, no flow of purge gas causes accumulation of evaporated components of a resist solvent in the chamber and also a flow of evaporated components to the outside when a wafer is taken out from the chamber.

The processing system described above has a resist-coating unit, a developing unit, a heating unit for use after resist coating, a cooling unit, etc, which are aligned along a wafer-transfer passage.

A flow of evaporated components from the heating unit could, for example, soil the inside of the coating and developing apparatus and a clean room.

Once the processing system has been soiled inside and outside, which could cause harmful effects to the procedure such as a resist-coating process, and resulting in low yields.

Not only that, the evaporated components could be attached to the inner wall of the processing chamber or wafer again, which could cause generation of particles, also resulting in low yields.

SUMMARY OF THE INVENTION

A purpose of the present invention is to provide a thermal processing apparatus, a coating and developing apparatus having a thermal processing apparatus, a method of thermal and developing processes and a pattern-forming method for enhanced uniformity of coated films after heated, which provides uniformity of coated film after thermal process, and particularly, for enhanced uniformity of pattern width after developed, for example, for thermal process after resist coating by controlling the amount of inert gas flown into a processing chamber or density of a resist solvent.

The present invention provides a thermal processing apparatus including: a processing chamber in which a heating plate is provided, a substrate coated with a coating solution being placed on the heating plate while the plate is heated to a predetermined temperature for heating the substrate; a gas supply passage for supplying an inert gas into the processing chamber; an exhaust passage for discharging the inert gas from the processing chamber to outside; a first flow amount regulator provided along the gas supply passage, for regulating a flow amount of the inert gas supplied into the processing chamber; a second flow amount regulator provided along the gas exhaust passage, for regulating a flow amount of the gas discharged from the processing chamber; and a controller for controlling the first and the second flow amount regulators so that the substrate is heated by the heating plate while the inert gas is circulating in the processing chamber at an extremely small first circulating amount, and then heated while the inert gas is circulating in the processing chamber at a second circulating amount larger than the first circulating amount.

Moreover, the present invention provides a coating and developing apparatus including: a carrier table on which at least one carrier containing a plurality of substrates is placed; a processor for coating a resist on each substrate taken out from the carrier and developing the substrate after exposure; a processing chamber in which a heating plate is provided, the resist-coated substrate being placed on the heating plate while the plate is heated to a predetermined temperature for heating the substrate to evaporate a solvent for the resist; a gas supply passage for supplying an inert gas into the processing chamber; an exhaust passage for discharging the inert gas from the processing chamber to outside; a first flow amount regulator provided along the gas supply passage, for regulating a flow amount of the inert gas supplied into the processing chamber; a second flow amount regulator provided along the gas discharged passage, for regulating a flow amount of the gas discharged from the processing chamber; and a controller for controlling the first and the second flow amount regulators so that the substrate is heated by the heating plate while the inert gas is circulating in the processing chamber at an extremely small first circulating amount, and then heated while the inert gas is circulating in the processing chamber at a second circulating amount larger than the first circulating amount.

Furthermore, the present invention provides a thermal processing method including the steps of: a step of placing a substrate coated with a coating solution on a heating plate in a processing chamber in which an inert gas is circulating; a first thermal-process step of heating the substrate on the heating plate while the inert gas is circulating at an extremely small first circulating amount; and a second thermal-process step of heating the substrate on the heating plate while the inert gas is circulating at a second circulating amount larger than the first circulating amount.

Moreover, the present invention provides a pattern forming method including the steps of: a step of coating a substrate surface with a resist; a step of placing the resist-coated substrate on a heating plate in a processing chamber in which an inert gas is circulating; a first thermal-process step of heating the substrate on the heating plate to evaporate a solvent for the resist while the inert gas is circulating at an extremely small first circulating amount; a second thermal-process step of heating the substrate on the heating plate to evaporate the solvent while the inert gas is circulating at a second flow amount larger than the first circulating amount; a step of exposing the substrate from which the solvent has been evaporated by the heating steps; and a resist-pattern forming step of forming a resist pattern on the exposed substrate by developing.

Furthermore, the present invention provides a thermal processing apparatus including: a processing chamber in which heating means is provided, a substrate coated with a coating solution with a solvent being placed on the heating means while the heating means is heated to a predetermined temperature for heating the substrate; a gas supply passage for supplying an inert gas into the processing chamber; an exhaust passage for discharging the inert gas from the processing chamber to outside; a first flow amount regulator provided along the gas supply passage, for regulating a flow amount of the inert gas supplied into the processing chamber; a second flow amount regulator provided along the gas exhaust passage, for regulating a flow amount of the gas discharging from the processing chamber; a sensor for detecting density of the solvent in the processing chamber; a controller for controlling the first and the second flow amount regulators, based on the density detected after the start of heating, so that an exhaust amount of the inert gas becomes a predetermined amount for a predetermined period until the solvent density reaches a predetermined density, and performing a control process so that the solvent density reaches the predetermined density when it has not reached or exceeded the predetermined density after the predetermined period has elapsed.

Furthermore, the present invention provides a thermal processing method including the steps of: a step of placing a substrate coated with a coating solution with a solvent on heating means in a processing chamber while an inert gas is circulating in the processing chamber; a step of detecting density of the solvent in the processing chamber; a step of controlling supply and exhaust amounts of the inert gas, based on the density detected after the start of heating, so that an exhaust amount of the inert gas becomes a predetermined amount for a predetermined period until the solvent density reaches a predetermined density; and a step of performing a control process so that the solvent density reaches the predetermined density when the solvent density has not reached or exceeded the predetermined density after the predetermined period has elapsed.

BRIEF DESCRIPTION OF DRAWINGS

FIG. 4 is a perspective view showing a part of the heating unit;

FIG. 5 is a graph explaining a thermal process performed by the heating unit;

FIG. 6 is a block diagram of the main part of a controller of the heating unit;

FIG. 7 illustrates an on-screen menu window for a controller-processing recipe;

FIG. 9 is a graph indicating correlation between flow amount of purge gas in thermal process after resist coating and critical dimension (CD);

FIG. 10 is a graph explaining a another thermal process performed by the heating unit; and FIG. 11 is a graph explaining still another thermal process performed by the heating unit.

DETAILED DESCRIPTION OF PREFERRED EMBODIMENTS

Preferred embodiments of a coating and developing apparatus having a thermal processing apparatus according to the present invention will be disclosed with reference to the attached drawings.

Figure 1:
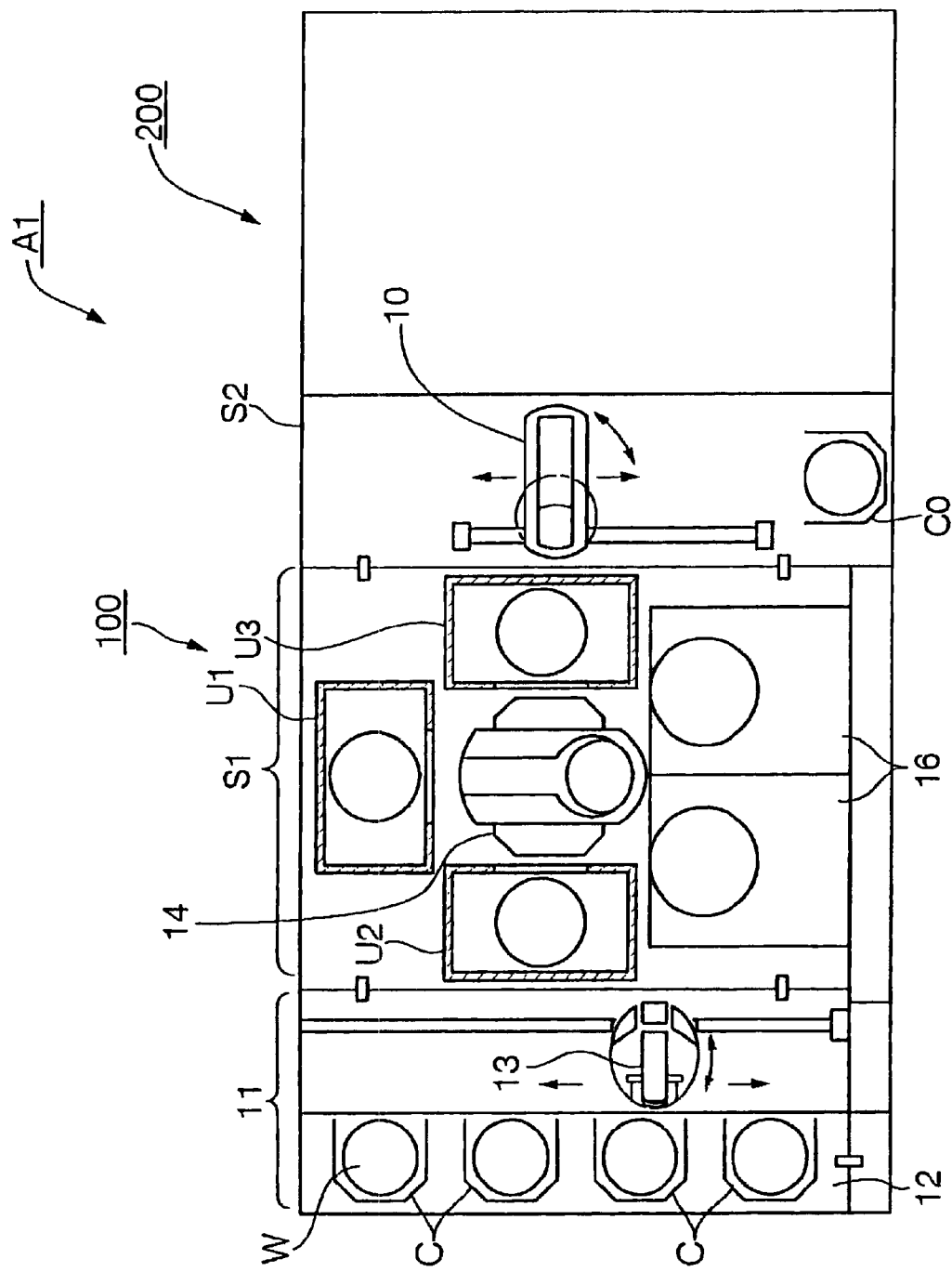
FIG. 1 is a plan view showing the entire structure of an embodiment of a resist-pattern forming apparatus having a heating unit according to the present invention.
Figure 2:
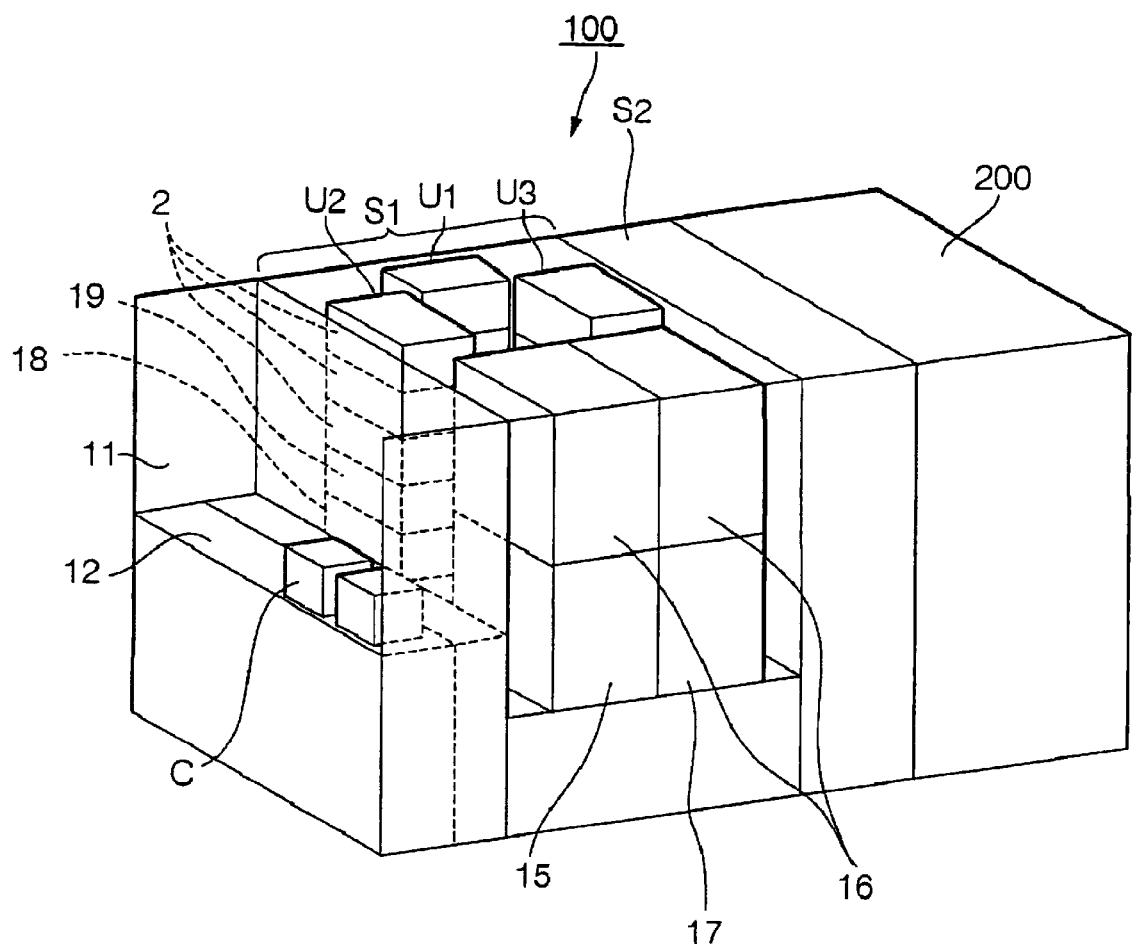
FIG. 2 is a perspective view showing the appearance of the resist-pattern forming apparatus.

FIGS. 1 and 2 are a plan view and appearance view, respectively, showing the entire structure of a resist-pattern forming system A1 in which a coating and developing apparatus 100 and an exposing apparatus 200 are connected to each other.

Disclosed first briefly is the entire structure of the coating and developing apparatus 100.

A carrier station 11 is used for receiving and transferring carriers C each containing, for example, 25 semiconductor wafers (called wafers) W as substrates. The carrier station 11 is equipped with a carrier table 12 on which each carrier C will be set and also a loading mechanism 13. The loading mechanism 13 is movable to left and right, upwards and downwards and rotatable about a vertical axis. Each wafer W (substrate) taken out from the carrier C by the loading mechanism 13 is transferred to a processing section S1 provided behind the carrier station 11 viewed from the carrier table 12 side.

A main-transfer mechanism 14 is provided in the middle of the processing section S1. When viewed from the carrier station 11 side, a coating unit 15, two developing units 16 and a reflection-protecting film forming unit 17 are arranged on the right side, and shelf units U1, U2 and U3 each having a stack of heating and cooling units are arranged on the left, the front and the back side, respectively, so that these units surround the main-transfer mechanism 14. One coating unit 15 and also one reflection-protecting film forming unit 17 are provided under the two developing units 16 in FIG. 2. However, several units may be provided for these coating unit 15, developing unit 16 and reflection-protecting film forming unit 17.

Each of the shelf units U1, U2 and U3 is provided with a stack of a heating unit 2 and a cooling unit 18 for a thermal processing apparatus, and also a wafer loading unit 19, etc.

The main-transfer mechanism 14 is movable to upwards and downwards, forwards and backwards and rotatable about a vertical axis. A wafer W is transferred by the main-transfer mechanism 14 among the shelf units U1, U2 and U3, the coating unit 15, the developing unit 16 and the reflection-protecting film forming unit 17. The loading mechanism 13 and the main-transfer mechanism 14 are not shown in FIG. 2 for brevity.

The processing section S1 is connected to the exposing apparatus 200 via an interface section S2 having a loading mechanism 10 and a buffer cassette C0. The loading mechanism 10 is movable to upwards and downwards, left and right and forwards and backwards, and rotatable about a vertical axis. A wafer W is transferred by the loading mechanism 10 between the processing section S1, the exposing apparatus 200 and the buffer cassette C0.

Disclosed briefly is wafer transfer in the resist-pattern forming system A1.

The carriers C each containing, for example, 25 wafers W are set on the carrier table 12 by a automatic transfer robot (or an operator). A wafer W is taken out from one of the carriers C by the loading mechanism 13 and transferred to the main-transfer mechanism 14 via a loading unit 19 (FIG. 2) in the shelf unit U2. The wafer W is transferred further to the reflection-protecting film forming unit 17 for forming a reflection-protecting film thereon. The reflection-protecting film is formed for preventing reflection which may otherwise occur under a chemical amplifying-type resist during exposure.

The wafer W is transferred to the shelf unit U2 (or U1, U3) for heating, cooling process, etc, followed by coating with a chemical-amplifying-type resist as a coating solution by the coating unit 15. The coated wafer W is heated by the heating unit 2 (pre-baking process) for evaporating a resist solvent for the chemical-amplifying-type resist. The pre-baked wafer W is transferred from a loading unit (not shown) in the shelf unit U3 to the exposing unit 200 via the interface unit S2, for an exposing process.

The exposed wafer W is returned to the processing section S1 via the loading unit (not shown) in the shelf unit U3 through the reverse route, for thermal and cooling processes. The wafer W is then transferred to the developing unit 16 by the main-transfer mechanism 14, for a developing process. The developed wafer W is heated and cooled, and transferred to the loading mechanism 13 via the route reverse to the route described above and returned, for example, to the carrier C that once contained the wafer W.

One of the features of the present invention is a thermal process called pre-baking after resist coating. The heating unit 2 that performs the pre-baking process will be disclosed with reference to FIG. 3A.

A processing chamber 21 is for example a cylinder-type chamber having a upper housing 21a and a lower chamber 21b. The upper housing 21a and the lower chamber 21b are attached at the bottom face of the former and the top face of the later to have a tightly closed inner space.

Figures 3A, 3B:
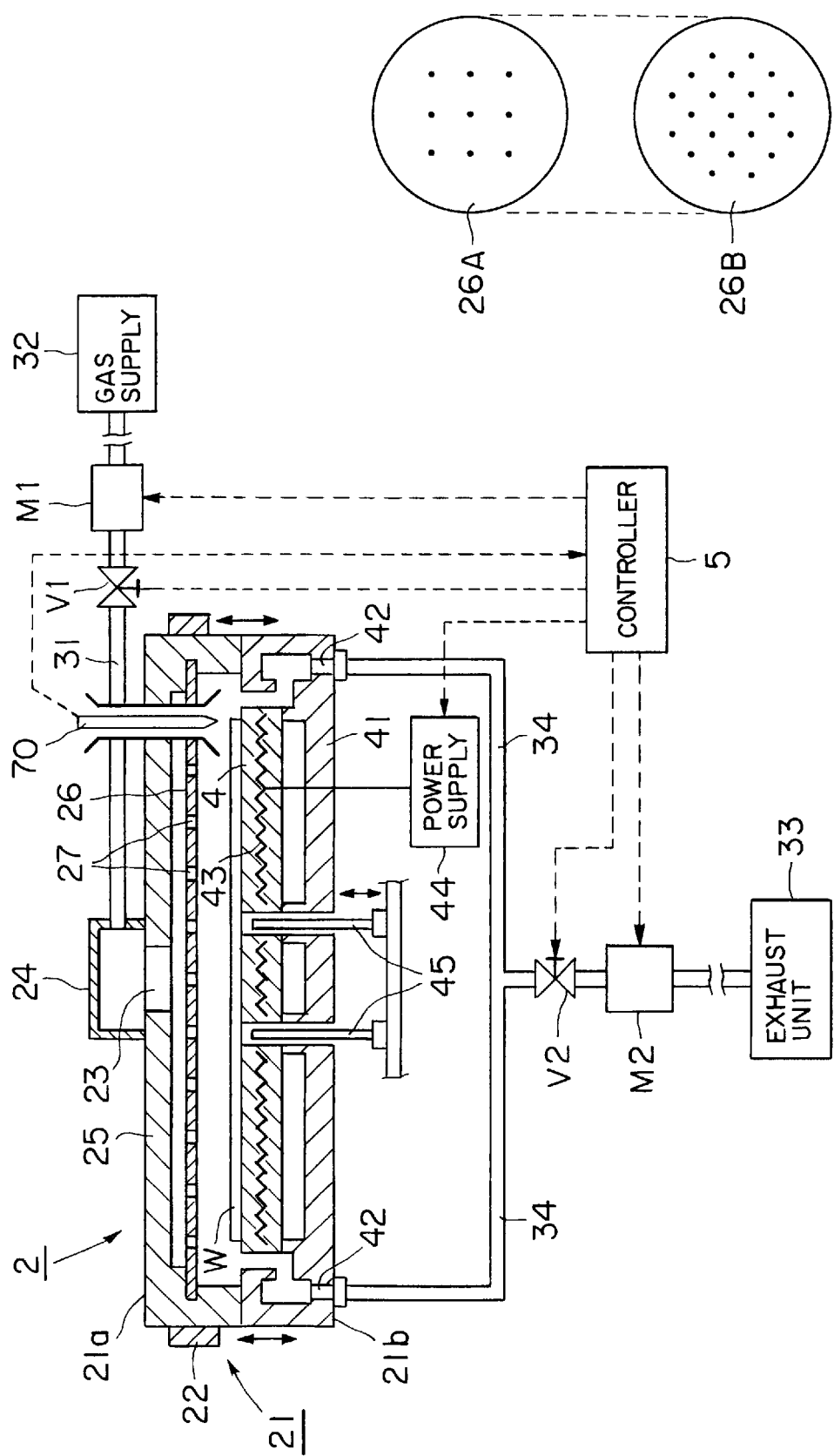
FIG. 3A is a vertical side view showing the heating unit installed in the resist-pattern forming apparatus.
FIG. 3B is a plan view showing buffer plates for a double-structure buffer plate set in the heating unit shown in FIG. 3A.

The upper housing 21a is supported by arms 22 at its both sides, as shown in FIG. 4, so that it can be elevated by a first elevator mechanism (not shown). A gas inlet 23 is formed on the middle of the upper housing 21a. Provided over the gas inlet 23 is a gas-supplying chamber 24 connected to the inlet 23. Under the gas inlet 23, a buffer plate 26 formed with many air pits is provided so that is faces a top plate 25 of the upper housing 21a. As shown in FIG. 3B, the buffer plate 26 is a double structure of an upper buffer plate 26A and a lower buffer plate 26B joined each other with a gap for a gas flowing therethrough. The lower buffer plate 26B is formed with many air pits compared to the upper buffer plate 26B so that a gas is supplied uniformly over a wafer W.

The gas-supplying chamber 24 is connected to a gas supply 32 through a gas-supplying pipe 31. A valve V1 and a first flow meter M1 are provided along the gas-supplying pipe 31 (a first flow regulator).

An inert gas such as air, nitrogen or argon gas is supplied as a purge gas, through the gas inlet 23, into the space enclosed by the top plate 25 and the buffer plate 26 from the gas-supplying chamber 24. The purge gas spreads over in the space and flows down through the air pits 27 so that it is supplied uniformly under the buffer plate 26. The gas-supplying pipe 31, the gas-supplying chamber 24 and the gas inlet 23 constitute a gas-supplying passage in this embodiment.

The lower chamber 21b is provided with a disk-like heating plate 4 mounted on a table 41. An exhaust-passage assembly 42 is provided around the disk-like heating plate 4 and the table 41. A heating element 43 such as a resister heater is installed in the heating plate 4. Power is supplied to the heating element 43 from a power supply unit 44 so that heating element 43 is heated to a predetermined temperature.

Also provided in the lower chamber 21b are several (three in this embodiment) elevating pins 45. A wafer W is loaded onto and taken out from the heating plate 4 while it is elevated by the elevating pins 45 as penetrating into and being retracted from the heating plate 4 and the table 41. The elevating pins 45 are elevated by a second elevating mechanism (not shown).

Connected to the exhaust-passage assembly 42 via an exhaust pipe 34 are a valve V2 and a second flow meter M2 (a second flow regulator). An exhaust unit 33 is connected to the flow meter M2. The exhaust pipe 34 and the exhaust-passage mechanism 42 constitute an exhaust passage.

The space enclosed by the upper housing 21a and the heating plate 41 acts as a heating chamber while the purge gas is supplied therein through the air pits 27 to create a heated atmosphere in the space. The amount of purge gas circulating in the heating unit 2 is decided in accordance with the amounts of purge gas to be supplied into and discharged from the processing chamber 21. The amount of purge gas circulating in the heating unit 2 is, for example, 1 liter/min when both the amounts of purge gas to be supplied and exhausted are 1 liter/min.

The heating unit 2 is controlled by a controller 5. Processing-recipe settings and the recipe management are also performed by the controller 5. In detail, the controller 5 controls the power supply unit 44 for the heating element 43, the valves V1 and V2, the flow meters M1 and M2, and the first and second elevating mechanisms.

Disclosed next is a pre-baking process for a wafer w after resist coating.

A resist-coated wafer W is transferred by the main-transfer mechanism 14 into the heating unit 2 in the shelf unit U while the upper housing 21a of the heating unit 2 is elevated. The wafer W is placed on the heating plate 4 by the co-operation of the elevating pins 45 and the main-transfer mechanism 14. The heating plate 4 has been heated to a predetermined temperature such as 100° C. by the heating element 43 based on a command from the controller 5.

The upper housing 21a moves downwards to close the processing chamber 21 after the wafer W has been placed on the heating plate 4. The controller 5 adjusts power supplied from the power supply 44 to the heating element 43 to control the temperature of the heating plate 4.

The controller 5 also adjusts the opening degrees of the valves V1 and V2. In detail, at the start of thermal process, the opening degrees of the valves V1 and V2 are adjusted so that the supply amount and the exhaust amount for the purge gas such as air are both 0.5 liter/min, for example. This adjustment provides the heating unit 2 with air at 0.5 liter/min as a first extremely small circulating amount. The thermal process is performed for a first period such as about 50 sec., while the pure gas is circulating in the processing chamber 21 at 0.5 liter/min.

The opening degrees of the valves V1 and V2 are further adjusted so that the purge gas is circulating in the processing chamber 21, for example, at 3 liter/min as a second circulating amount. The thermal process is then performed further for a second period such as about 40 sec., while the pure gas is circulating in the processing chamber 21 at 0.3 liter/min.

After the pre-bake process for about 90 sec., in total, the valves V1 and V2 are closed to halt the supply and exhaustion of purge gas. The upper housing 21a is opened and the wafer W is transferred to the cooling unit by the co-operation of the elevating pins 45 and the main-transfer mechanism 14.

As disclosed, one of the features of the present lies in purge gas-circulating-amount control in the pre-bake process. Parameters such as the circulating amount of purge gas are freely set on the controller 5 as a processing recipe for the pre-bake process.

The controller is described briefly with reference to FIG. 6.

The controller 5 includes a CPU (central processing unit) and memories storing several programs. The controller 5 has several functions such as a recipe creator 51, a recipe storage 52, a recipe selector 53 and a recipe executer 54.

The recipe creator 51 accepts recipe settings for thermal process such as heating temperature and time. The created recipe is stored in the recipe storage 52. The recipe creator 51 includes an on-screen menu window on screen for recipe-setting and edition. Several recipes are prepared, for example, in accordance with resist types. An operator selects a particular recipe, via the recipe selector 53, from among the recipes stored in the recipe storage 52. The selected recipe is executed by the recipe executer 54. These procedures are performed along a bus B1.

FIG. 7 illustrates an on-screen menu window for the recipe creator 51 for the processing recipe.

A menu window 60 is displayed for varying the circulating amount of purge gas on the way of pre-bake process, as disclosed with reference to FIG. 5. In detail, parameters that can be set on the menu window 60 are a heating temperature of the heating plate 4, a heating time for heating a wafer W placed on the heating plate 4, the first period, the first circulating amount, the second period and the second circulating amount. The parameters are varied via the recipe settings for a desired pre-bake process.

The pre-bake process for a wafer W in the heating unit 2 after a chemical-amplifying type resist has been applied on the wafer W improves uniformity of pattern with after developing. The following is a possible explanation for this improvement.

A chemical-amplifying-type resist will generate acid when exposed. The acid promotes resist-resolving reaction. The chemical-amplifying-type resist includes a base resin as the major component, a protective base for restricting dissolution of the base resin to a developing solution and a photo-oxidizing agent, easily exposed to little exposing energy.

When a chemical-amplifying-type resist is used, the exposed wafer W is heated for promoting the resist-resolving reaction. The wafer W is then cooled to restrict exceeded resist-resolving reaction for developing.

In the resist-pattern forming system A1 described above, the thermal process after exposure corresponds to a thermal process for promoting the resist-resolving reaction whereas the following cooling process to a cooling process for restricting the exceeded resist-resolving reaction.

Figure 8:
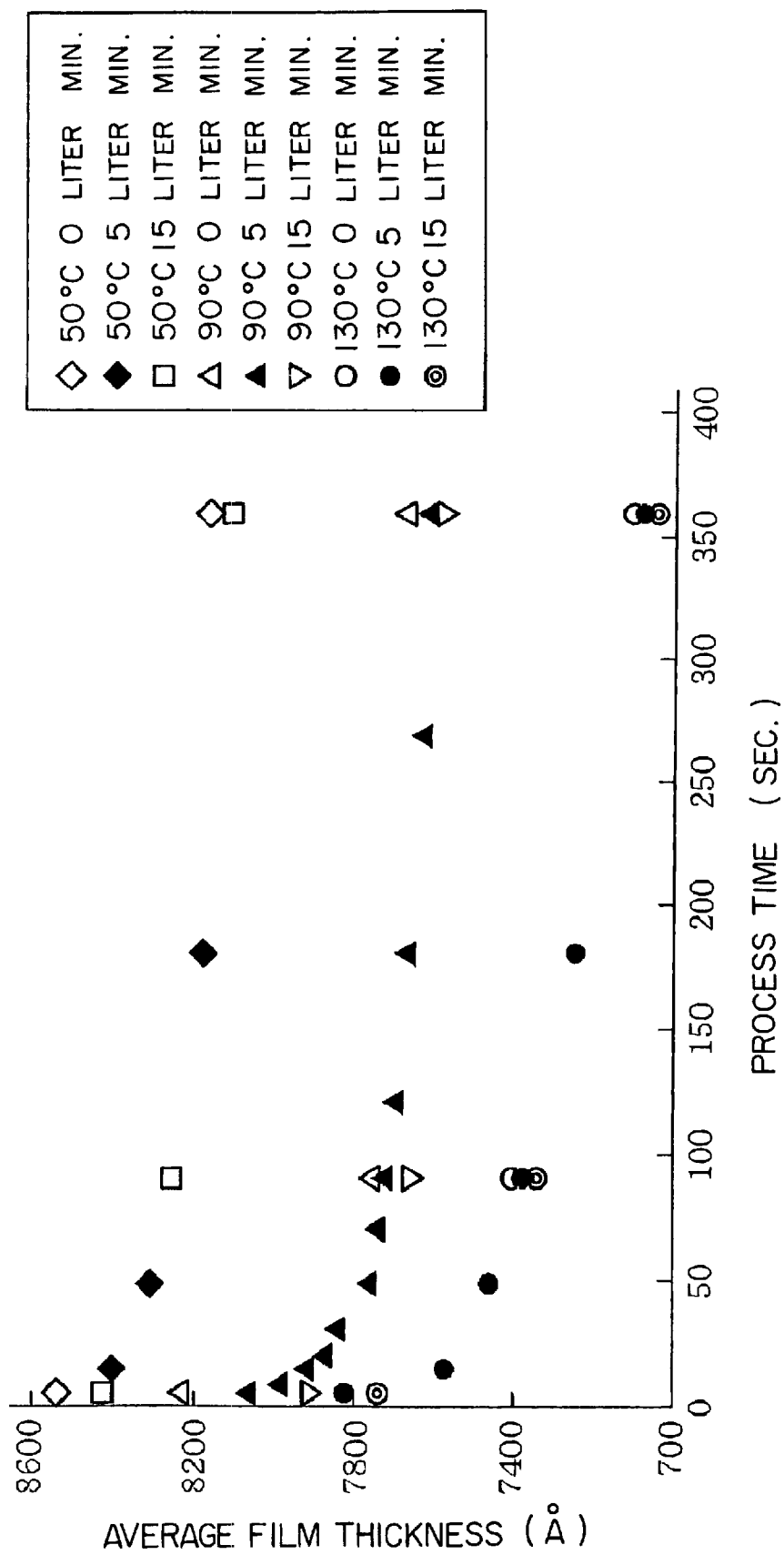
FIG. 8 is a graph indicating correlation between processing time in thermal process after resist coating and resist-film thickness.

The pre-bake process after resist coating is performed for evaporating a solvent such as thinner as a resist solvent. Variation in thickness of a chemical-amplifying-type resist-film formed on a wafer W in this pre-bake process was observed as shown in FIG. 8. The pre-bake process requirements were that 50° C., 90° C., and 130° C. for processing temperature of the heating plate 4, and 0 liter/min, 5 liter/min and 15 liter/min for circulating amount of purge gas varied at each processing temperature.

The graph in FIG. 8 indicates that the film thickness was drastically thin after about 15 min., from the start of pre-bake process at each processing temperature. Also observed in this experiment was that the film thickness becomes thinner as the supply and exhaust amounts of purge gas become larger. The purge gas becomes thinner due to evaporation of resist solvent. It is evident that the resist solvent is much evaporated at the start of pre-bake process and easily evaporated as the supply and exhaust amounts of purge gas become larger.

Also observed as shown in FIG. 9 is Critical Dimension (CD) indicating several pattern values such as pattern width, interval and position, dependent on the amount of purge gas circulating in the processing chamber 21.

The CD-purge gas flow-amount dependency was observed through the pre-bake process in which a wafer W coated with a chemical-amplifying-type resist was pre-baked on the heating plate 4 at 120° C. for 90 sec. (heating time) while the purge was circulating in the processing chamber 21 at 1 liter/min, 2 liter/min, 3 liter/min, 5 liter/min and 10 liter/min, followed by exposing and developing processes, for in-plane range and 3 $\sigma$ a of the developed pattern width. The in-plane range was obtained by subtracting the minimum pattern width from the maximum pattern Width both measured on the wafer W. The value 3 $\sigma$ was obtained by multiplying the standard deviation by three. It is indicated in the graph in FIG. 9 that the smaller the in-plane range and 3 $\sigma$, the higher the uniformity of developed pattern width.

It is evident from these observations that the in-plane range and 3 $\sigma$ in CD become larger as the amount of purge gas circulating in the processing chamber 21 becomes larger, hence the uniformity of developed pattern width becoming worse.

In addition, the inventors of the present invention have known that a pre-bake process at no supply and exhaustion of purge gas enhances the uniformity of developed pattern width.

At a high evaporating rate for resist solvent, major components of a chemical-amplifying-type resist, such as a photo-oxidizing agent could be scattered from the resist with evaporation of the solvent. The photo-oxidizing agent itself will not evaporate. The agent will thus be scattered from the resist where the solvent is much evaporating, resulting in agent-scattered sections and agent-non-scattered sections on the resist. The amount of the photo-oxidizing agent will vary on the wafer W at the completion of pre-bake process. This un-uniformity of resist film could cause un-uniformity of developed pattern width.

The pre-bake process in this experiment was performed for about 90 sec., so that the amount of resist solvent evaporated from the wafer W became almost uniform and thus resist film thickness was also almost uniform.

In this invention, the supply and exhaust amounts of purge gas are both about 0.5 liter/min (the first circulating amount) extremely small for about 50 sec., (the first period) from the start of processing. The amount of resist solvent to be evaporated depends on the circulating amount of purge gas at the start of processing. The solvent will thus evaporate gradually at the start of processing at such a small circulating amount. The slower the evaporating rate, the less the solvent be scattered, and thus the less the photo-oxidizing agent be scattered with evaporation of the solvent, resulting in less variation in agent-scattered sections and agent-non-scattered sections on the resist.

The first thermal process as disclosed above is followed by the second thermal process in which the purge gas is circulating in the process chamber 21 at about 3 liter/min (a second circulating amount) extremely larger than the first circulating amount for about 40 sec. (a second period), for example. Resist-evaporated components deposited in the first thermal process and that generated in the second thermal process will be discharged from the processing chamber 21 during the second thermal process. It is thus restricted that these resist-evaporated components remain in the processing chamber 21 and spread over into the coating and developing apparatus 100.

The evaporating amount of resist solvent will become small when about 40 sec. passes from the start of thermal process. The evaporating rate of resist solvent will thus not become so high even if the supply and exhaust amounts of purge gas become larger. This achieves less scattering of photo-oxidizing agent, resulting in less variation in agent-scattered sections and agent-non-scattered sections on the resist, and hence agent scattering can be kept on the wafer W. This achieves uniformity of the resist film on the wafer W, so that the developing process will be performed uniformly on the wafer W, for uniform pattern width after developing.

The first thermal process is preferably performed in the state in which almost no or an extremely small amount of purge gas is circulating in the processing chamber 21. The first circulating amount is preferably in the range from 0 liter/min to 0.5 liter/min. The first period is preferably in the range, for example, from 20 sec. to 40 sec., for stable evaporating amount and rate for resist solvent.

On the contrary, the second circulating amount is preferably in the range from 1 liter/min to 20 liter/min in the second thermal process. The second period is preferably in the range, for example, from 30 sec. to 60 sec., for the solvent accumulated in the processing chamber 21 to be exhausted in the second thermal process.

The first and the second circulating amounts are freely set on the controller 5. This circulating amount control may be performed by adjusting the opening degree of the valves V1 and V2. It may also be performed by a mass-flow controller instead of the valves and the flow meters. In detail, the controller 5 may adjust a first mass-flow meter for adjusting the supply amount of purge gas and a second mass-flow meter for adjusting the discharging amount of purge gas.

The uniformity of resist pattern width formed on a wafer W was observed by scanning electron microscopy after the pre-bake process in the processing chamber 21 at 100° C. for heating temperature, 90 sec. for heating period, 50 sec. for the first period, 0.5 liter/min. for the first circulating amount, 40 sec. for the second period and 3 liter/min. for the second circulating amount, and other necessary processes.

It was observed that this pre-bake process achieved high uniformity for the resist pattern compared to a pre-bake process with the circulating amount of purge gas constant at 3 liter/min, with no scattering of resist solvent into the system.

The first and the second circulating amounts may be gradually varied as shown in FIG. 10 in the present invention. This gradual change in circulating amount can be performed with a mass-flow controller instead of the valves and the flow meters. In detail, the controller 5 may adjust a first mass-flow meter for adjusting the supply amount of purge gas and a second mass-flow meter for adjusting the discharging amount of purge gas. FIG. 10 indicates gradual increase in the first circulating amount with almost no circulation at the start of thermal process, thus achieving enhanced uniformity of resist pattern width.

The heating temperature, the heating period, the first period, the first circulating-amount increasing curve, the second period, the second circulating-amount increasing curve, etc., are entered via the on-screen process-recipe menu window for parameter settings, for a pre-bake process under the set recipe. The first and the second circulating-amount increasing curves may be selected from among several curves, such as the one shown in FIG. 10, generated based on formulas with necessary values and exponentials entered via the process recipe-setting window.

The circulating amount of purge gas can be varied step by step or gradually during the pre-bake process when it is 0.5 liter/min or less for, for example, 40 sec. after the start of thermal process, as shown in FIG. 11.

It is preferable to perform valve control while the processing chamber 21 is opened and closed for wafer transfer after the thermal process, for restricting scattering of evaporated components from the processing chamber 21.

In detail, after the second thermal process has completed, the valve V2 is closed and the valve V1 is opened for circulating the purge gas into the processing chamber 21 at a low circulating rate such as 1 liter/min or less. The valve V2 is closed for halting discharging temporarily otherwise the processing chamber 21 may be at a negative pressure inside. The valve V1 is opened to circulate the purge gas at a low rate for giving a low positive pressure in the processing chamber 21.

The upper housing 21a is then elevated and the valve V2 is opened. The upper housing 21a can be elevated easily due to the inside positive pressure. Contaminants thus can be sucked out simultaneously with the opening of the upper housing 2a.

The elevating upper housing 21a is stopped and the valve V1 is closed. The valve V1 has been opened before this closing for suction discharging while a fixed amount of purge gas is circulating in the processing chamber 21. The elevating pins 45 are then elevated and the valve V2 is closed for halting suction discharging.

In addition to the circulating-rate control as disclosed above, the resist solvent inside the heating unit 2 is controlled for its density at constant for a predetermined period after the start of thermal process.

This solvent-density control is performed for attaining enhanced CD values and optimum discharging and intake flow amounts for enough discharging flow amounts to each wafer W. This control restricts scattering of resist-solvent evaporated components from the processing chamber 21 and also attachment of the evaporated components to the inner wall of the processing chamber 21 or wafer W again, which could cause generation of particles, also resulting in low yields.

For this solvent-density control, a solvent-density sensor 70 is provided on the upper part of the heating unit 2 so that it penetrates into the processing chamber 21 through the upper housing 21a and the buffer plate 26 as shown in FIG. 3A. No only on the upper part of the heating unit 2, the solvent-density sensor 70 may be penetrated into the processing chamber 21 from the arm 22 side. In addition, instead of sensing solvent density directly, the sensor 70 may be a pressure sensor or a wafer film-thickness sensor for measuring the solvent density based on the presser inside the heating unit 2 or the thickness of film formed on a wafer W.

The solvent density detected by the sensor 70 after the start of thermal process is sent to the controller 5. Based on the detected value, the controller 5 controls the valves V1 and V2 so that a discharging flow amount reaches a predetermined fixed amount for a predetermined period until the solvent density reaches a predetermined value.

When the solvent density has not reached the predetermined value even after the predetermined period has elapsed, the controller 5 performs exhaust-amount decreasing and/or thermal-process time extending process. On the contrary, when the solvent density has exceeded the predetermined value after the predetermined period has elapsed, the controller 5 performs exhaust-amount increasing and/or thermal-process time shorting process. The variation in solvent density in the processing chamber 21 is displayed on a display screen (not shown) provided on the controller 5.

It is preferable to set the maximum and minimum values for solvent density so that an alarm goes off when the solvent density goes beyond the range between the maximum and minimum values on each wafer W.

The predetermined solvent density and exhaust amount are decided in accordance with the type of resist and resist solvent and may be pre-stored in a memory of the controller 5.

The detected solvent density is used to adjust exhaust amount and thermal process time as described above. It may, however, be used to adjust the thermal characteristics or heating temperature for the heating element 43, instead.

Not only the heating unit as disclosed, any type of heating unit can be used in the present invention, at least it has a mechanism in that a purge gas is supplied into and exhausted from a processing chamber so that an amount-controlled purge gas is circulating in the chamber.

The circulating amount of purge gas can be controlled by the valves and the mass-flow controller as described above or their combination in which the valves are used as one flow amount regulator and the mass-flow controller as another flow amount regulator.

Moreover, the heating method according to the present invention can be applied to thermal process for substrates coated with any resist other than the chemical-amplifying type resist or other solution such as chemical solution for color filters in an LCD-substrate coating and developing system.

Furthermore, the heating method according to the present invention can be applied to thermal process after exposure or for substrates coated with solution other than for pre-bake process in which it has been coated with resist.

The purge gas-circulating amount control is advantageous for controlling drying rate of solutions for processing substrate surface. LCD substrate can also be used in the present invention.

As disclosed above, according to the present invention, the start of thermal process (the first thermal process) provides the first circulating amount at which an amount of circulating inert gas is extremely small. This circulating amount control achieves low evaporation rate for coating solution at the start of thermal process, thus restricting scattering of other components of the coating solution which will basically not evaporate, so that variation in the amounts of coating solution components on a wafer can be restricted.

In addition, the second thermal process that follows the first thermal process provides the second circulating amount at which an amount of circulating inert gas is smaller than the first circulating amount. This circulating-amount control restricts accumulation of scattering components of the coating solution on the wafer in the processing chamber, thus achieving uniformity of the coated film.

Moreover, according to the present invention, the density of solvent for a coating solution is detected in the processing chamber. Based on the detected density, supply and exhaust amounts of inert gas are controlled so that an exhaust amount of the inert gas becomes a predetermined amount for a predetermined period until the solvent density reaches a predetermined value. A necessary control is performed so that the solvent density reaches the predetermined value when it has not reached or exceeded the predetermined value after a predetermined period has elapsed. This solvent-density control also achieves uniformity of the coated film.

What is claimed is:

1. A thermal processing apparatus comprising:
    a processing chamber in which a heating plate is provided, a substrate coated with a coating solution being placed on the heating plate while the plate is heated to a predetermined temperature for heating the substrate;
    a gas supply passage for supplying an inert gas into the processing chamber;
    an exhaust passage for discharging the inert gas from the processing chamber to outside;
    a first flow amount regulator provided along the gas supply passage, for regulating a flow amount of the inert gas supplied into the processing chamber;
    a second flow amount regulator provided along the gas exhaust passage, for regulating a flow amount of the gas discharged from the processing chamber; and
    a controller for controlling the first and the second flow amount regulators so that the substrate is heated by the heating plate while the inert gas is circulating in the processing chamber at a first circulating amount, and then heated while the inert gas is circulating in the processing chamber at a second circulating amount larger than the first circulating amount.

2. The thermal processing apparatus according to claim 1, wherein each or either of the first and the second flow amount regulators includes a valve.

3. The thermal processing apparatus according to claim 1, wherein each or either of the first and the second flow amount regulators includes a mass-flow meter.

4. A coating and developing apparatus comprising:
a carrier table on which at least one carrier containing a plurality of substrates is placed;
a processor for coating a resist on each substrate taken out from the carrier and developing the substrate after exposure;
a processing chamber in which a heating plate is provided, the resist-coated substrate being placed on the heating plate while the plate is heated to a predetermined temperature for heating the substrate to evaporate a solvent for the resist;
a gas supply passage for supplying an inert gas into the processing chamber;
an exhaust passage for discharging the inert gas from the processing chamber to outside;
a first flow amount regulator provided along the gas supply passage, for regulating a flow amount of the inert gas supplied into the processing chamber;
a second flow amount regulator provided along the gas discharged passage, for regulating a flow amount of the gas discharged from the processing chamber; and
a controller for controlling the first and the second flow amount regulators so that the substrate is heated by the heating plate while the inert gas is circulating in the processing chamber at a first circulating amount, and then heated while the inert gas is circulating in the processing chamber at a second circulating amount larger than the first circulating amount.

5. The thermal processing apparatus according to claim 4, wherein each or either of the first and the second flow amount regulators includes a valve.

6. The thermal processing apparatus according to claim 1, wherein each or either of the first and the second flow amount regulators includes a mass-flow meter.

7. A thermal processing method comprising the steps of:
a step of placing a substrate coated with a coating solution on a heating plate in a processing chamber in which an inert gas is circulating;
a first thermal-process step of heating the substrate on the heating plate while the inert gas is circulating at a first circulating amount; and
a second thermal-process step of heating the substrate on the heating plate while the inert gas is circulating at a second circulating amount larger than the first circulating amount.

8. The thermal processing method according to claim 7, wherein the coating solution includes a resist.

9. The thermal processing method according to claim 8, wherein the resist is a chemical-amplifying-type resist that generates acid when exposed, the acid promoting a resolving reaction for the resist, a solvent for the chemical-amplifying-type resist being evaporated in the first and the second thermal processes.

10. A thermal processing method comprising the steps of:
a step of placing a substrate coated with a coating solution on a heating plate in a processing chamber in which an inert gas is present;
a first thermal-process step of heating the substrate on the heating plate while the inert gas is present and does not circulate; and
a second thermal-process step of heating the substrate on the heating plate while the inert gas is circulating.

11. A pattern forming method comprising the steps of:
a step of coating a substrate surface with a resist;
a step of placing the resist-coated substrate on a heating plate in a processing chamber in which an inert gas is circulating;
a first thermal-process step of heating the substrate on the heating plate to evaporate a solvent for the resist while the inert gas is circulating at a first circulating amount;
a second thermal-process step of heating the substrate on the heating plate to evaporate the solvent while the inert gas is circulating at a second flow amount larger than the first circulating amount;
a step of exposing the substrate from which the solvent has been evaporated by the heating steps; and
a resist-pattern forming step of forming a resist pattern on the exposed substrate by developing.

12. The pattern forming method according to claim 11, wherein the resist is a chemical-amplifying-type resist that generates acid when exposed, the acid promoting a resolving reaction for the resist, the method further comprising the steps of:
a heating step of heating the substrate after exposed to promote the resolving reaction for the resist; and
a cooling step of cooling the substrate heated in the heating steps to restrict the promotion of the resolving reaction for the resist,
wherein the resist-pattern forming step includes a step of developing the substrate cooled in the cooling step to form the resist pattern.

13. A thermal processing apparatus comprising:
a processing chamber in which heating means is provided, a substrate coated with a coating solution with a solvent being placed on the heating means while the heating means is heated to a predetermined temperature for heating the substrate;
a gas supply passage for supplying an inert gas into the processing chamber;
an exhaust passage for discharging the inert gas from the processing chamber to outside;
a first flow amount regulator provided along the gas supply passage, for regulating a flow amount of the inert gas supplied into the processing chamber;
a second flow amount regulator provided along the gas exhaust passage, for regulating a flow amount of the gas discharging from the processing chamber;
a sensor for detecting density of the solvent in the processing chamber;
a controller for controlling the first and the second flow amount regulators, based on the density detected after the start of heating, so that an exhaust amount of the inert gas becomes a predetermined amount for a predetermined period until the solvent density reaches a predetermined density, and performing a control process so that the solvent density reaches the predetermined density when it has not reached or exceeded the predetermined density after the predetermined period has elapsed.

14. The thermal processing apparatus according to claim 13, wherein the controller performs an exhaust-amount decreasing process so that the solvent density reaches the predetermined density when the solvent density has not reached the predetermined density after the predetermined period has elapsed whereas performs an exhaust-amount increasing process so that the solvent density reaches the predetermined density when the solvent density has exceeded the predetermined density after the predetermined period has elapsed.

15. The thermal processing apparatus according to claim 13, wherein the controller performs a heating time-extending process so that the solvent density reaches the predetermined density when the solvent density has not reached the predetermined density after the predetermined period has elapsed whereas performs a heating-time shorting process so that the solvent density reaches the predetermined density when the solvent density has exceeded the predetermined density after the predetermined period has elapsed.

16. The thermal processing apparatus according to claim 13, wherein the controller performs a thermal characteristic-adjusting process so that the solvent density reaches the predetermined density when the solvent density has not reached or exceeded the predetermined density after the predetermined period has elapsed.

17. The thermal processing apparatus according to claim 13, wherein the controller performs a heating-temperature adjusting process so that the solvent density reaches the predetermined density when the solvent density has not reached or exceeded the predetermined density after the predetermined period has elapsed.

18. A thermal processing method comprising the steps of:
a step of placing a substrate coated with a coating solution with a solvent on heating means in a processing chamber while an inert gas is circulating in the processing chamber;
a step of detecting density of the solvent in the processing chamber;
a step of controlling supply and exhaust amounts of the inert gas, based on the density detected after the start of heating, so that an exhaust amount of the inert gas becomes a predetermined amount for a predetermined period until the solvent density reaches a predetermined density; and
a step of performing a control process so that the solvent density reaches the predetermined density when the solvent density has not reached or exceeded the predetermined density after the predetermined period has elapsed.

19. The thermal processing method according to claim 18, wherein the controlling step performs an exhaust-amount decreasing process so that the solvent density reaches the predetermined density when the solvent density has not reached the predetermined density after the predetermined period has elapsed whereas performs an exhaust-amount increasing process so that the solvent density reaches the predetermined density when the solvent density has exceeded the predetermined density after the predetermined period has elapsed.

20. The thermal processing method according to claim 18, wherein the controlling step performs a heating time-extending process so that the solvent density reaches the predetermined density when the solvent density has not reached the predetermined density after the predetermined period has elapsed whereas performs a heating-time shorting process so that the solvent density reaches the predetermined density when the solvent density has exceeded the predetermined density after the predetermined period has elapsed.

21. The thermal processing method according to claim 18, wherein the controlling step performs a thermal characteristic-adjusting process so that the solvent density reaches the predetermined density when the solvent density has not reached or exceeded the predetermined density after the predetermined period has elapsed.

22. The thermal processing method according to claim 18, wherein the controlling step performs a heating-temperature adjusting process so that the solvent density reaches the predetermined density when the solvent density has not reached or exceeded the predetermined density after the predetermined period has elapsed.

* * * * *